United States Patent [19]
Parker

[11] Patent Number: 5,896,079
[45] Date of Patent: Apr. 20, 1999

[54] HIGH FREQUENCY COMMON MODE FERRITE BEAD

[75] Inventor: Richard G. Parker, Wallkill, N.Y.

[73] Assignee: Fair-Rite Products Corporation, Wallkill, N.Y.

[21] Appl. No.: 08/881,449

[22] Filed: Jun. 24, 1997

Related U.S. Application Data

[60] Provisional application No. 60/022,600, Jul. 25, 1996.
[51] Int. Cl.[6] .................... H01F 17/04; H01F 17/06; H01F 27/24
[52] U.S. Cl. .................. 336/221; 336/233; 336/175; 336/172
[58] Field of Search .................... 336/172, 175, 336/221, 233

[56] References Cited

U.S. PATENT DOCUMENTS

| | | | |
|---|---|---|---|
| 1,994,767 | 3/1935 | Heintz | 336/229 |
| 2,762,861 | 9/1956 | Somers | 336/175 |
| 3,319,207 | 5/1967 | Davis | 336/229 |
| 4,160,966 | 7/1979 | Kennedy | 336/155 |
| 4,656,451 | 4/1987 | Pomponio | 336/175 |
| 5,392,017 | 2/1995 | Munoz et al. | 336/221 |
| 5,520,297 | 6/1993 | Crowhurst | 336/175 |

FOREIGN PATENT DOCUMENTS

| 5-67527 | 3/1993 | Japan | 336/221 |

*Primary Examiner*—Michael L. Gellner
*Assistant Examiner*—Anh Mai
*Attorney, Agent, or Firm*—Anthony J. Casella; Gerald E. Hespos; Ludomir A. Budzyn

[57] ABSTRACT

Common mode ferrite bead is provided for suppressing EMI/RFI. The bead includes a ferrite body of substantially rectangular configuration with top and bottom surfaces, first and second end surfaces and first and second side surfaces. Six apertures pass entirely through the body from the first end surface to the second end surface. Grooves may be provided in bottom surface. Two conductors are provided through the body such that each of the conductors passes through each of three of the apertures through the body. The opposed ends of the conductors are bent to fit in the grooves in the bottom surface of the body. These ends of the respective conductors define contact which can be soldered to conductive pads on a circuit board.

6 Claims, 2 Drawing Sheets

HIGH FREQUENCY COMMON MODE FERRITE BEAD

This application claims priority on U.S. Provisional Application Ser. No. 60/022,600, filed Jul. 25, 1996.

BACKGROUND OF THE INVENTION

1. Field of the Invention.

The subject invention relates to a high frequency common mode ferrite bead for surface mounting on a circuit board.

2. Description of the Prior Art.

Ferrites are widely used as attenuators or suppressors of unwanted signals in electrical circuits. When the problem of EMI/RFI arises in a circuit, the first step is to isolate the source. The second step is to diminish its output to an acceptable level without destroying the necessary information being transmitted at other frequencies.

The prior art has included ferrite suppressors that are inserted into a circuit containing useful signals as well as noise or interference. The desired signals will pass through while the undesired energy will be attenuated. This is accomplished through the impedance of the ferrite which is frequency sensitive. Direct and low frequency currents see only the conductor, and are unimpeded. The high frequency energy couples with the ferrite and impedance is developed which has inductive and resistive components. When a line is passed through a ferrite core, low frequency energy is transmitted with little loss, whereas higher frequency energy encounters the inductive reactance caused by the real part of the complex permeability of the ferrite. The inductive reactance reduces the conducted EMI current and introduces an insertion loss. At still higher frequencies, where the real part of the permeability of the ferrite material decreases and the inductive reactance falls, the lossy characteristics dominate and the resistive componet of the impedance assumes the main role of providing the insertion loss for dissipating the unwanted energy.

Ferrite suppressors have taken many forms in the prior art. A significant number of very desirable ferrite suppressors are sold by Fair-Rite Products Corp., the assignee of the subject application. For example, Fair-Rite part #2744041447 is identified generally by the numeral 10 in FIGS. 1 and 2. The prior art ferrite surface mount bead 10 of FIGS. 1 and 2 includes a generally rectangular ferrite body 12 having top and bottom surfaces 14 and 16, first and second end surfaces 18 and 20 and first and second side surfaces 22 and 24. Two rectangular slots 26 and 28 extend entirely through the ferrite body 14 from the first end 18 to the second end 20 at a position midway between the top and bottom surfaces 14 and 16 and equally spaced from the respective side surfaces 22 and 24. These slots are connected by a narrower slot that is designed to limit the sidewise movement of the conductive strips 30 and 32 that pass through the slots 26 and 28 respectively. Used as a common mode choke, the source and return electrical currents are conducted in opposite directions on these strips. Any direct or low frequency current, which would be equal, create magnetic fields that are equal and opposite, and therefore cancel, resulting in a net zero magnetic field. Any common mode, meaning in-phase signals travelling on both conductors, will be attenuated by the characteristics of the ferrite since the magnetic fields created by the signal would not cancel. The ends of the respective conductive strips 30 and 32 are folded around the respective end faces 18 and 20 of the ferrite body 14 and into abutting face-to-face engagement with the bottom surface 16 thereof. These end faces may then be electrically and mechanically mounted to conductive pads on the surface of a circuit board. Common-mode surface mount beads as shown in FIGS. 1 and 2 have proved to be very effective.

Fair-Rite Products Corp. also sells a ferrite bead identified as part #2943666681 and indicated generally by the numeral 34 in FIG. 3. The bead 34 includes a cylindrical ferrite body 36 having a total of six apertures passing therethrough substantially parallel to the axis of the cylinder. Two conductive wires are threaded through the apertures such that each wire passes through three of the six apertures. In particular, each wire will enter the ferrite core at one end, will pass entirely to the opposed end and reverse directions. The wire will reverse directions again at the original end and will continue back to the opposed end. The wires from the suppressor shown in FIG. 3 will be bent away from an axial direction and down toward a surface board where the wires may be mounted in conductive through holes or may otherwise soldered into connection with conductive regions on a circuit board. The prior art bead 34 is not designed for surface mount applications.

Another prior art ferrite bead is shown in U.S. Pat. No. 5,455,552 which issued to Metsler on Oct. 3, 1995 and is assigned to Steward, Inc. The bead shown in U.S. Pat. No. 5,455,552 includes a generally rectangular ferrite body with two parallel slots extending therethrough. Two conductors of generally U-shape are arranged parallel to one another such that one leg of each conductor passes through each of the two slots in the ferrite body. These conductors continue through the ferrite body and are mounted in conductive through holes of a circuit board. However, when employed as a common mode choke, the magnetic fields created are complex, do not completely cancel, and the close proximity of the conductors to each along with the dielectric constant of the ferrite material that is greater than that of air that results in severe degradation of the attenuative characteristics of the device above about 100 MHz.

It is an object of the subject invention to provide a ferrite common mode bead intended for surface mount applications and exhibiting very high impedance over a very wide frequency range.

SUMMARY OF THE INVENTION

The subject invention is directed to a high impedance common mode bead for surface mount applications. The bead of the subject invention includes a rectangular ferrite body having a top surface, a bottom surface, first and second end surfaces extending parallel to one another between the top and bottom surfaces and first and second side surfaces orthogonally aligned to the respective top, bottom and end surfaces. It will be appreciated that the terms top and bottom used throughout this application are intended for convenience, and are not intended to define required gravitational orientation of the common mode bead. The ferrite body preferably is of conveniently small dimensions to define an acceptable footprint on a circuit board. In particular, the ferrite body may define a length of approximately 0.394" (10 mm), a width of approximately 0.260" and a height of approximately 0.15711" (4 mm).

The ferrite body is provided with 3 apertures extending from the first end entirely through to the second end and parallel to the opposed top and bottom surfaces. These apertures are enlarged cylindrically at each end of the aperture to accommodate a conductor. Each conductor will create a magnetic field in the common surrounding ferrite material if an electrical current is caused to pass through these conductors. If the flow of the current is equal and in opposing directions, as in the case of a DC power source and return, the magnetic field will be equal and opposite, resulting in a cancellation of the effect of the flux that would create the magnetic saturation of the ferrite material. On the other hand, unwanted electromagnetic signals being conducted by both conductors in the same direction, known as common mode signals, which typically create EMI, will not cause cancelling magnetic fields, and will encounter an impedance that will attenuate these signals. Other desired differential mode signals of lower amplitude which carry desired information in digital or analog form will not be diminished or attenuated since they will be substantially 180° out of phase and this will not create cancelling magnetic fields.

The ferrite body is provided with six apertures extending therethrough from the first end entirely through to the second end and substantially parallel to the opposed top and bottom surfaces. For manufacturing convenience, at least one pair of the apertures may define a slot, such that the two lateral extremes of a slot may be the functional equivalent of two spaced apart apertures. The bottom surface of the ferrite bead may include grooves extending the length of this surface. More particularly, the bottom surface may include four grooves, with two grooves extending inwardly from each of the opposed end surfaces.

The bead of the subject invention further includes first and second wires passing through the apertures. Each wire makes a total of three passes through the body and has ends bent to fit into one of the grooves in the bottom surface.

The bead of the subject invention may be mounted on the surface of a circuit board. More particularly, the ends of the respective wires are soldered or otherwise electrically connected to conductive pads on the circuit board. The conductive pads on the circuit board may be joined to entirely separate circuit components on the board. (Alternatively, two of the conductive pads may be connected to one another to effectively join the two wires to one another such that the bead may effectively accommodate a total of six conductive passes through the ferrite body.) This is a differential mode (normal mode) design.

The body of the bead is compaction pressed or otherwise formed, as with injection molding, of a high resistivity nickel zinc ferrite, such as Fair-Rite material #44. Such a material provides the low reluctance path for the flux created by the current flow in the conductors. The DC or desired signal flux fields cancel. The common mode EMI (undesired) current flows in the same direction in the conductors, creating flux fields that do not cancel, and thus creating an impedance to the signals that are to be impeded. The result is similar to the results of windings in non-common mode chokes that have been employed in the electronic industry in the past when there is no need or desire to preserve differential mode currents and attenuate common mode currents.

The bead of the subject invention offers a means of increasing impedance without greatly increasing physical size. Contrasted to the typical prior art common mode bead, there is no simple cancellation of a flux field by an opposing flux field, as occurs, for example, in the toroidal shapes widely used in common mode circuitry.

The subject bead relies upon a number of magnetic flux fields being cancelled by an equal and opposite magnetic field. A number of common areas may be involved each with one or more pairs of opposing fields.

Previous common mode RF beads or chokes utilizing either single or two passes of conductors through a magnetic ferrite body demonstrate a much lower Z than is achieved with the subject invention.

Additionally, when compared to the above-referenced prior art design of FIG. 3, impedance increases steadily from 1 MHz to 700–800 MHz, having a self-resonant frequency many times higher than the prior art of FIG. 3, which typically peaks in the 75–150 MHz range and then decreases rapidly. When utilized as a differential mode RF choke by connecting the windings in series through traces on the circuit board, the design achieves an unprecedented magnitude of impedance, reaching 700 ohms at 300 MHz and remaining above 300 ohms to 1 Ghz. This is caused by the substantial physical separation of the conductors in each winding and the physical separation of the windings one from the other, resulting in low capacitance within and between windings. This resulting low capacitance raises the self resonance frequency of the device and hence the useful frequency range or bandwidth for both common mode and differential mode applications.

DETAILED DESCRIPTION OF THE PREFERRED EMBODIMENT

Figure 1:
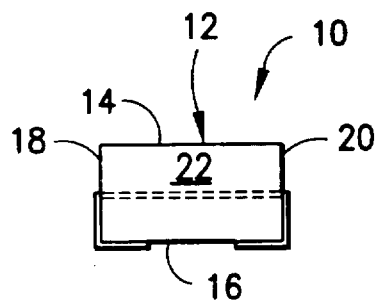
FIG. 1 is a side elevational view of a prior art ferrite bead.
Figure 2:
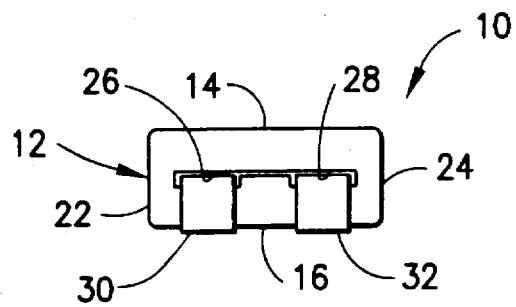
FIG. 2 is an end elevational view of the prior art bead shown in FIG. 1.
Figure 3:
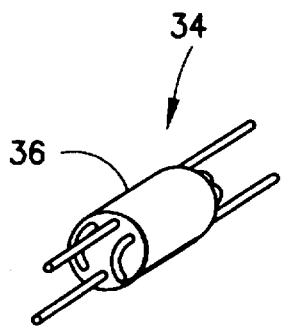
FIG. 3 is a perspective view of a second prior art bead.
Figure 4:
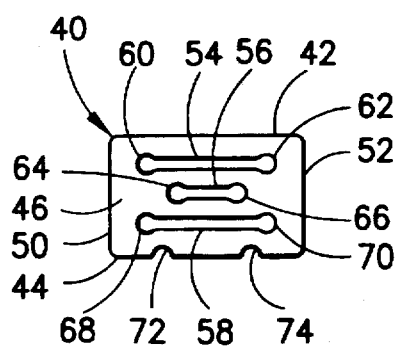
FIG. 4 is an end elevational view of the ferrite body for a common mode bead in accordance with the subject invention.
Figure 5:
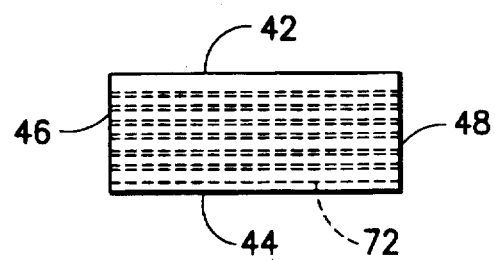
FIG. 5 is a side elevational view of the body shown in FIG. 4.

The bead of the subject invention includes a ferrite body identified generally by the numeral 40 in FIGS. 4–7. The body 40 is generally rectangular and includes a top surface 42, a bottom surface 44, first and second ends 46 and 48 and first and second sides 50 and 52.

The body 40 includes three slots 54, 56 and 58 extending entirely therethrough from the first end 46 to the second end 48. The slots 54, 56 and 58 are aligned substantially parallel to the respective top and bottom surfaces 42 and 44. Portions of the slot 54 nearest the side surfaces 50 and 52 are enlarged to define apertures 60 and 62. Similarly portions of the slot 56 are enlarged to define apertures 64 and 66. However, the slot 56 is narrower than the slot 54, and hence the apertures 64 and 66 are spaced further from the respective side surfaces 50 and 52. The slot 58 is substantially identical to the slot 54 and includes enlarged apertures 68 and 70 substantially registered with the respective enlarged apertures 60 and 62 of the slot 54. The enlarged apertures 60–70 could be formed entirely separately, thereby avoiding the portions of each slot 54, 56 and 58 between the enlarged apertures 60–70.

The bottom surface 44 of the body 40 includes grooves 72 and 74 respectively extending parallel to the respective side surfaces 50 and 52.

Figure 6:
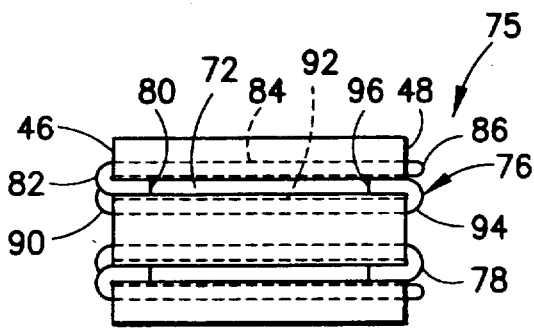
FIG. 6 is a bottom plan view of the common mode bead including the body of FIGS. 4 and 5 and conductors wound therethrough.
Figure 7:
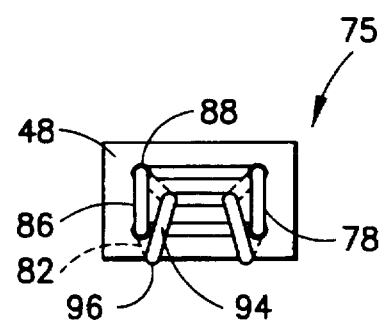
FIG. 7 is an end elevational view of the bead shown in FIG. 6.

As shown in FIGS. 6 and 7, the body 40 is part of a common mode bead 75 which further comprises conductors 76 and 78. The conductor 76 includes a first end 80 engaged in a portion of the groove 72. The first conductor 76 then includes a first bend 82 of approximately 180°. The first conductor 76 then includes a first pass 84 extending entirely through the body 40 utilizing the aperture 72 and extending from the first end 46 to the second end 48. The first conductor 76 then includes a second bend 86 at the second end 48 and a second pass 88 through aperture 60 in the body 40 from the second end 48 back to the first end 46 thereof. The first conductor 76 then includes a third bend 90 and a third pass 92 through the body utilizing the aperture 64. The portion of the first conductor 76 emerging from the second end surface 48 is then bent again to define a fourth bend 94. The first conductor 76 includes second end 96 which is fit in the portion of the groove 72 adjacent the first end surface 46 of the body 40. The second conductor 78 is similarly configured to include opposed ends engaged in the groove 74. Portions of the second conductor 76 between the opposed ends include a total of three passes through the apertures 62, 66 and 70 respectively with a total of four 180° bends adjacent the respective ends surfaces 46 and 48. The common mode bead 75 of FIGS. 6 and 7 then is mounted to conductive pads on a circuit board.

Figure 8:
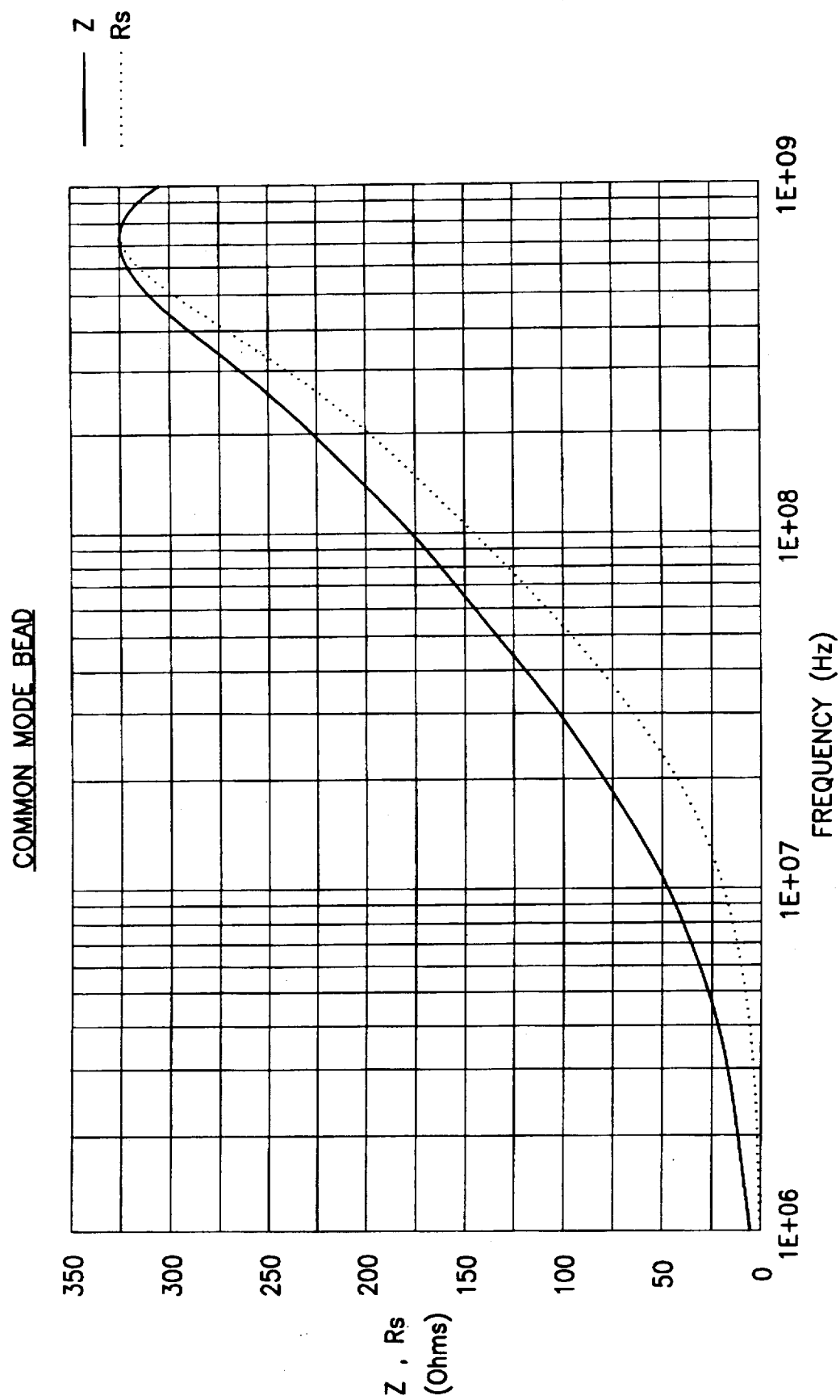
FIG. 8 is a graph showing the performance of the bead shown in FIGS. 6 and 7.

FIG. 8 shows the performance of the bead at different frequencies. As noted above, impedance increases steadily to levels that could not reasonably have been achieved or expected from the prior art.

While the invention has been described with respect to a preferred embodiment, it is apparent that various changes can be made without departing from the scope of the invention as defined by the appended claims.

What is claimed is:

1. A common mode bead comprising:

a substantially rectangular ferrite body having a top surface, a bottom surface, first and second end surfaces and first and second side surfaces, three slots passing through the body from the first surface to the second surface, each said slot being formed with two spaced-apart enlarged portions, each said enlarged portion defining an aperture which passes through the body from the first surface to the second surface; and first and second conductors, each said conductor passing through three of the apertures through the body, each of said conductors further having ends folded against the bottom surface of the body, whereby the ends of the respective conductors can be connected to conductive regions on a surface of a circuit board.

2. The bead of claim 1, wherein the bottom surface of the body includes a pair of grooves, the ends of the conductors being fitted in the respective grooves.

3. The bead of claim 1, wherein said first conductor passes through each said slot, and said second conductor passes through each said slot.

4. A common mode bead comprising:

a substantially rectangular ferrite body having a top surface, a bottom surface, first and second end surfaces and first and second side surfaces, six apertures passing through the body from the first surface to the second surface, said six apertures including first, second, third, fourth, fifth and sixth apertures, a first slot being formed between said first and second apertures with said first and second apertures being in communication, a second slot being formed between said third and fourth apertures with said third and fourth apertures being in communication, and a third slot being formed between said fifth and sixth apertures with said fifth and sixth apertures being in communication; and first and second conductors, each said conductor passing through three of the apertures through the body.

5. The bead of claim 4, wherein said first conductor extends through said first, third and fifth apertures, and said second conductor extends through said second, fourth and sixth apertures.

6. The bead of claim 4, wherein said slots extend between said first and second surfaces.

* * * * *